United States Patent
Adusumilli et al.

(10) Patent No.: US 11,569,170 B2
(45) Date of Patent: Jan. 31, 2023

(54) SUBSTRATE WITH A BURIED CONDUCTOR UNDER AN ACTIVE REGION FOR ENHANCED THERMAL CONDUCTIVITY AND RF SHIELDING

(71) Applicant: GLOBALFOUNDRIES U.S. INC., Santa Clara, CA (US)

(72) Inventors: Siva P. Adusumilli, South Burlington, VT (US); Mark David Levy, Williston, VT (US); Ramsey Hazbun, Colchester, VT (US); Alvin Joseph, Williston, VT (US); Steven Bentley, Menands, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 216 days.

(21) Appl. No.: 17/064,602

(22) Filed: Oct. 7, 2020

(65) Prior Publication Data
US 2022/0108951 A1    Apr. 7, 2022

(51) Int. Cl.
| | |
|---|---|
| *H01L 23/535* | (2006.01) |
| *H01L 21/74* | (2006.01) |
| *H01L 21/768* | (2006.01) |
| *H01L 23/367* | (2006.01) |
| *H01L 23/48* | (2006.01) |
| *H01L 29/10* | (2006.01) |
| *H01L 21/8234* | (2006.01) |
| *H01L 27/092* | (2006.01) |
| *H01L 29/778* | (2006.01) |
| *H01L 29/735* | (2006.01) |

(52) U.S. Cl.
CPC .......... *H01L 23/535* (2013.01); *H01L 21/743* (2013.01); *H01L 21/76805* (2013.01); *H01L 21/76831* (2013.01); *H01L 23/367* (2013.01); *H01L 23/481* (2013.01); *H01L 27/092* (2013.01); *H01L 29/735* (2013.01); *H01L 29/7786* (2013.01)

(58) Field of Classification Search
CPC ............. H01L 21/743; H01L 21/76805; H01L 21/76831; H01L 23/535; H01L 23/367; H01L 23/481; H01L 27/092; H01L 29/735; H01L 29/7786
See application file for complete search history.

(56) References Cited

U.S. PATENT DOCUMENTS

| | | | |
|---|---|---|---|
| 6,744,072 B2 | 6/2004 | Romano et al. | |
| 6,956,250 B2 | 10/2005 | Borges et al. | |
| 8,450,804 B2 | 5/2013 | Sekar et al. | |
| 10,446,643 B2 | 10/2019 | Adusumilli et al. | |
| 2007/0205502 A1 | 9/2007 | Liu et al. | |
| 2010/0019385 A1 | 1/2010 | Bartley et al. | |
| 2012/0223406 A1* | 9/2012 | Warabino | H01L 21/743 |
| | | | 257/E29.024 |

(Continued)

*Primary Examiner* — Herve-Louis Y Assouman
(74) *Attorney, Agent, or Firm* — David Cain

(57) ABSTRACT

A semiconductor device is provided, the semiconductor device comprising a substrate having merged cavities in the substrate. An active region is over the merged cavities in the substrate. A thermally conductive layer is in the merged cavities in the substrate, whereby the thermally conductive layer at least partially fills up the merged cavities in the substrate. A first contact pillar connects the thermally conductive layer in the merged cavities in the substrate with a metallization layer above the active region.

20 Claims, 10 Drawing Sheets

(56) References Cited

U.S. PATENT DOCUMENTS

| | | | |
|---|---|---|---|
| 2015/0137238 A1* | 5/2015 | Tsunemi | H01L 28/40 438/118 |
| 2019/0013382 A1* | 1/2019 | Stamper | H01L 29/0653 |
| 2019/0229185 A1* | 7/2019 | Adusumilli | H01L 29/0653 |
| 2021/0028082 A1* | 1/2021 | Usami | H01L 29/16 |

* cited by examiner

SUBSTRATE WITH A BURIED CONDUCTOR UNDER AN ACTIVE REGION FOR ENHANCED THERMAL CONDUCTIVITY AND RF SHIELDING

FIELD OF THE INVENTION

The disclosed embodiments relate generally to semiconductor devices, and more particularly, to semiconductor devices that have an improved thermal conductivity and methods of manufacture thereof.

BACKGROUND

Semiconductor device scaling leads to an increase in power density as more devices are packed onto a single chip. There is a need to transfer heat away from the devices during device operation in order to improve device performance and reliability. The heat generated may be transferred from the devices to an external heat sink.

Heat conduction from the devices to the external heat sink is inefficient as the heat is conducted through semiconductor device layers having a low thermal conductivity such as a substrate layer or dielectric layers. The inefficient heat transfer may cause the temperature of the devices to increase during device operation leading to degradation in device performance and poor reliability. Thus, there is a need for an improved semiconductor device to overcome the challenges mentioned above.

SUMMARY

In an aspect of the present disclosure, a semiconductor device is provided. The semiconductor device comprises a substrate having merged cavities in the substrate. An active region is over the merged cavities in the substrate. A thermally conductive layer is in the merged cavities in the substrate, whereby the thermally conductive layer at least partially fills up the merged cavities in the substrate. A first contact pillar connects the thermally conductive layer in the merged cavities in the substrate with a metallization layer above the active region.

In another aspect of the present disclosure, a semiconductor device is provided. The semiconductor device comprises a substrate having merged cavities in the substrate. An active region is over the merged cavities in the substrate, whereby the active region comprises an epitaxial layer. The merged cavities in the substrate may extend across at least part of a length and a width of the active region. A thermally conductive layer is in the merged cavities in the substrate, whereby the thermally conductive layer at least partially fills up the merged cavities in the substrate. A first contact pillar connects the thermally conductive layer in the merged cavities in the substrate with a metallization layer above the active region.

In yet another aspect of the present disclosure, a method of fabricating a semiconductor device is provided, the method comprising providing a substrate having merged cavities in the substrate. An active region is provided over the merged cavities in the substrate. A thermally conductive layer is formed in the merged cavities in the substrate, whereby the thermally conductive layer at least partially fills up the merged cavities in the substrate. A first contact pillar is formed connecting the thermally conductive layer in the merged cavities in the substrate with a metallization layer above the active region.

Numerous advantages may be derived from the embodiments described below. The embodiments provide semiconductor devices with an improved thermal conductivity. The devices may be fabricated using front side processing steps thereby providing an efficient integration with conventional semiconductor device fabrication. The thermally conductive layer in the merged cavities in the substrate may be precisely aligned in terms of lateral location or depth in the substrate relative to an active region in the devices leading to a more efficient heat transfer during operation of the devices. Heat generated during operation of the devices may also be conducted from the active region to the thermally conductive layer in the merged cavities in the substrate through a contact pillar to an external heat sink. The contact pillar may be a through-silicon via (TSV) or a trench. The thermally conductive layer in the merged cavities in the substrate may also provide radio frequency (RF) or Faraday shielding between the substrate and RF devices in the active region.

BRIEF DESCRIPTION OF THE DRAWINGS

The disclosed embodiments will be better understood from a reading of the following detailed description, taken in conjunction with the accompanying drawings.

Figure 1A:
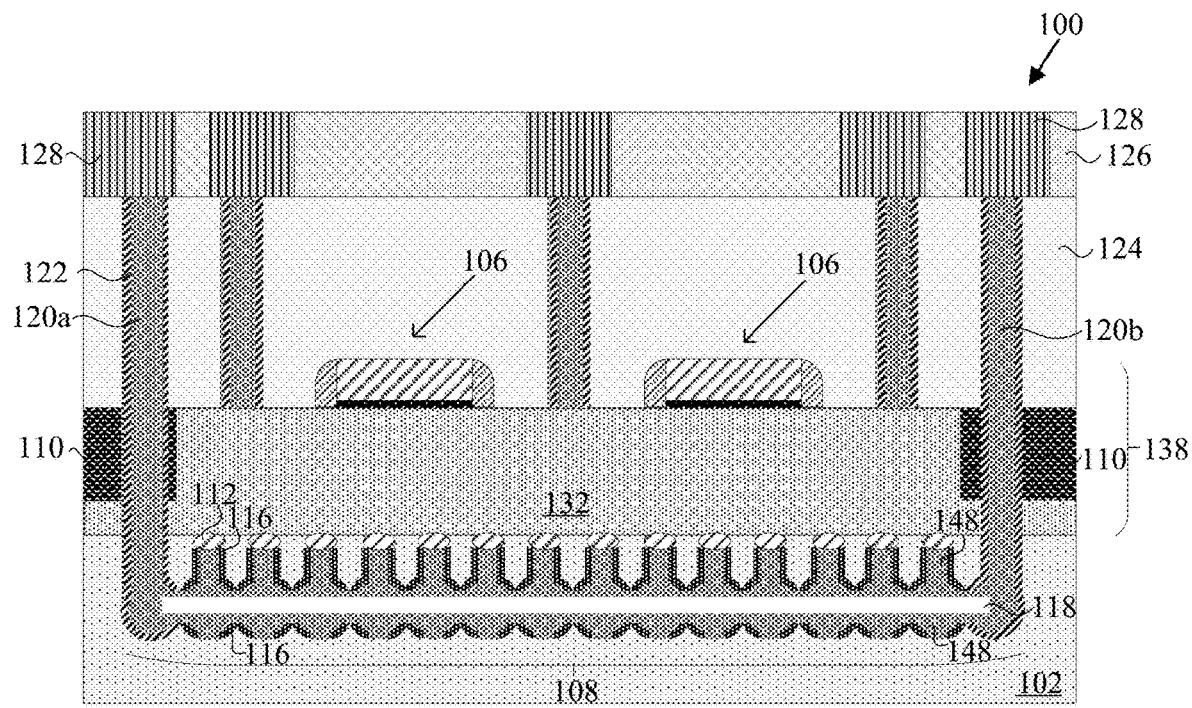
FIG. 1A is a cross-section view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a cross-section view of a semiconductor device 100, according to an embodiment of the disclosure. In one embodiment, the semiconductor device 100 may be a complementary metal oxide semiconductor (CMOS) or any other suitable semiconductor devices. Referring to FIG. 1A, the semiconductor device 100 comprises a substrate 102 with merged cavities 108 in the substrate 102. An active region 138 is over the merged cavities 108 in the substrate 102. The active region 138 may comprise an epitaxial layer 132. A thermally conductive layer 148 may be in the merged cavities 108 in the substrate 102, whereby the thermally conductive layer 148 at least partially fills up the merged cavities 108 in the substrate 102. A first contact pillar 120a connects the thermally conductive layer 148 in the merged cavities 108 in the substrate 102 with a metallization layer 128 above the active region 138. The thermally conductive layer 148 may be made of a thermally conductive material with a thermal conductivity higher than silicon such as copper (Cu), tungsten (W), graphene, aluminum nitride (AlN), carbon nanotubes (CNT), diamond (C), or any other suitable thermally conductive material.

The substrate 102 and the epitaxial layer 132 may be made of silicon (Si), other elementary semiconductor material, such as germanium (Ge) or a compound semiconductor. The compound semiconductor may include gallium nitride (GaN), silicon carbide (SiC), gallium arsenide (GaAs), indium arsenide (InAs), indium phosphide (InP), another suitable compound semiconductor, or a combination thereof. In some embodiments, the substrate 102 and the epitaxial layer 132 may be made of the same semiconductor material. In further embodiments, the substrate 102 and the epitaxial layer 132 may be made of different semiconductor materials.

The active region 138 may comprise an epitaxial layer 132 and gate stacks 106 of transistors over the epitaxial layer 132. Although not shown, the active region 138 may comprise source, drain and well regions in the epitaxial layer 132. Isolation structures 110 may be formed in the epitaxial layer 132. In some embodiments, the isolation structures 110 may be shallow trench isolation (STI) structures. The isolation structures 110 may extend at least across part of a thickness of the epitaxial layer 132. In further embodiments, the isolation structures 110 may extend across the entire thickness of the epitaxial layer 132. Although not shown, the active region 138 may further comprise RF devices or any other suitable active or passive devices.

A plug 112 may be formed over an upper portion of the merged cavities 108 in the substrate 102. The plug 112 is an optional feature of the embodiments and may be made of germanium, silicon or any other suitable semiconductor material. The plug 112 may seal the upper portion of the merged cavities 108 in the substrate 102. The merged cavities 108 in the substrate 102 may directly contact the epitaxial layer 132 of the active region 138.

In one embodiment, an airgap 118 may extend across the merged cavities 108 in the substrate 102, whereby the airgap 118 may be surrounded by the thermally conductive layer 148. The airgap 118 may be due to incomplete filling up of the merged cavities 108 in the substrate 102 by the thermally conductive layer 148. In further embodiments, the thermally conductive layer 148 may completely fill up a remaining portion of the merged cavities 108 in the substrate 102 below the plug 112 thereby eliminating the airgap 118.

A dielectric liner 116 may be over sidewalls of the upper portion of the merged cavities 108 in the substrate 102, whereby the dielectric liner 116 may be arranged below the plug 112. The thermally conductive layer 148 in the merged cavities 108 in the substrate 102 may be electrically grounded by connecting the metallization layer 128 to a ground terminal. In embodiments, the metallization layer 128 may be connected to an external heat sink for further dissipation of generated heat from the active region 138. In embodiments, the dielectric liner 116 may be over part of a lower portion of the merged cavities 108 in the substrate 102 and exposing a bottom portion of the merged cavities 108 in the substrate 102. Thereby, the bottom portion of the merged cavities 108 in the substrate 102 is not covered by the dielectric liner 116. The thermally conductive layer 148 may come in contact with the substrate 102 through the bottom portion of the merged cavities 108 in the substrate 102 thereby presenting an alternative thermally conductive path for heat dissipation from the substrate 102 through the thermally conductive layer 148 and to the first and second contact pillars, 120a and 120b, respectively. The dielectric liner 116 may be made of thermally grown or deposited silicon dioxide ($SiO_2$), aluminum oxide ($Al_2O_3$), or any other suitable electrically isolating dielectric material.

A second contact pillar 120b may connect the thermally conductive layer 148 in the merged cavities 108 in the substrate 102 with the metallization layer 128 above the active region 138. The first and second contact pillars 120a and 120b may be made of suitable thermally conductive material comprising copper (Cu), tungsten (W) or any other suitable thermally conductive material. In some embodiments, the first and second contact pillars 120a and 120b may be made of the same materials as the thermally conductive layer 148. In further embodiments, the first and second contact pillars 120a and 120b may be made of different materials from the thermally conductive layer 148. A barrier liner material 122 may be formed over sidewalls of the first and second contact pillars 120a and 120b. The barrier liner material 122 may be made of titanium nitride (TiN), tantalum nitride (TaN), tungsten (W), titanium (Ti), tantalum (Ta), or any other suitable barrier liner materials. The first and second contact pillars 120a and 120b may be a metal line, a metal trench or a through-silicon via (TSV).

A shallow trench isolation (STI) 110 may surround a portion of the first and second contact pillars 120a and 120b, respectively, in the epitaxial layer 132. In embodiments, the shallow trench isolation 110 may extend across part of a depth of the epitaxial layer 132. In further embodiments, the shallow trench isolation 110 may extend across the entire depth of the epitaxial layer 132. The shallow trench isolation 110 may electrically isolate the first and second contact pillars, 120a and 120b, respectively, from the active region 138.

Figure 1B:
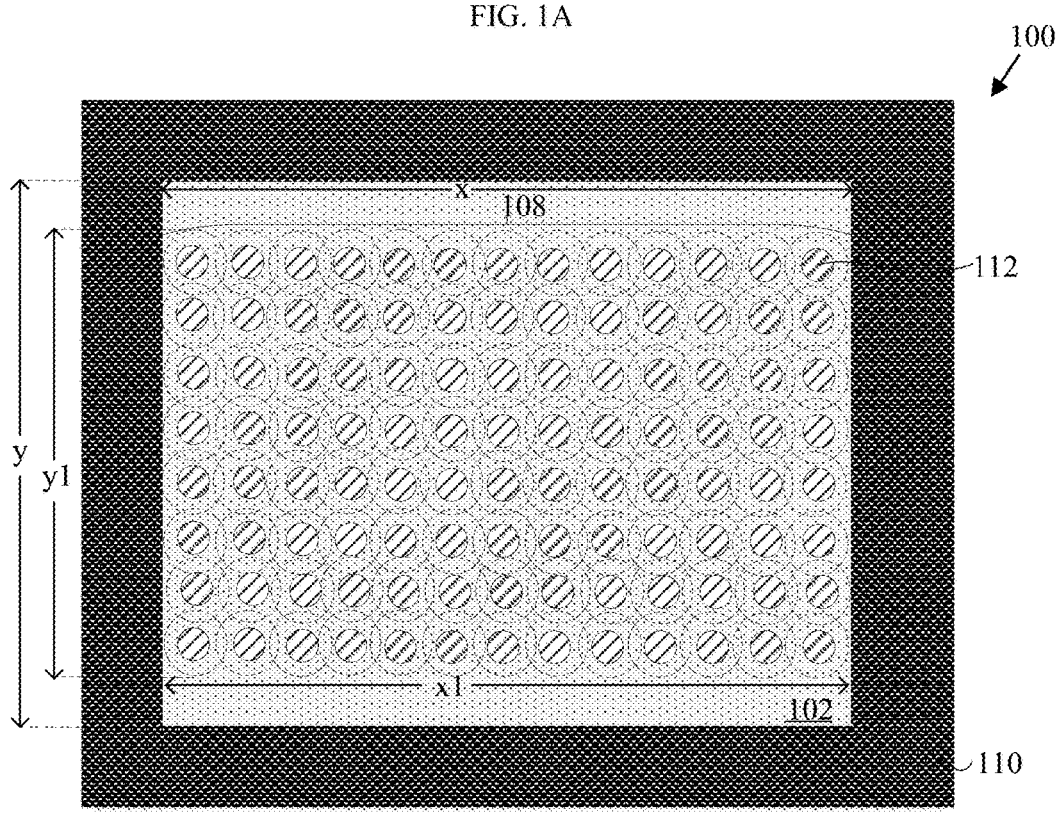
FIG. 1B is a schematic top-down view of a semiconductor device, according to embodiments of the disclosure.

FIG. 1B is a schematic top-down view of a semiconductor device 100, according to embodiments of the disclosure. Referring to FIG. 1B, the merged cavities 108 below an upper surface of the substrate 102 is shown as dashed outlines. An array of plugs 112 may be formed over an upper portion of the merged cavities 108 in the substrate 102, filling up the upper portion of the merged cavities 108 in the substrate 102. In embodiments, the plugs 112 and the upper portion of the merged cavities 108 in the substrate 102 may have a circular shape. In further embodiments, the plugs 112 and the upper portion of the merged cavities 108 in the substrate 102 may have a square or oval shape. A continuous substrate layer 102 is between the plugs 112 and over the merged cavities 108 in the substrate 102. For simplicity, the epitaxial layer 132, the gate stacks 106, the first and the second contact pillars, 120a and 120b, respectively, the metallization layer 128 and the first and the second interlayer dielectric layers, 124 and 126, respectively, are not shown in FIG. 1B. The isolation structure 110 may be formed above the substrate 102 and along a perimeter of the active region 138, to thereby define a length x and a width y of the active region 138. A length x1 of the merged cavities 108 in the substrate 102 may be less than or equal to the length x of the active region 138. A width y1 of the merged cavities 108 in the substrate 102 may be less than or equal to the width y of the active region 138. The merged cavities 108 in the substrate 102 may be tailored to cover the entire length x and width y of the active region 138 or to cover specific portions of the semiconductor device 100.

During device operation, heat generated in the active region 138 may conduct through the plug 112 to the thermally conductive layer 148 in the upper portion of the merged cavities 108 in the substrate 102. The heat may be dissipated through the first and second contact pillars, 120*a* and 120*b*, respectively, to the metallization layer 128 and to an external heat sink. Alternatively, heat from the substrate 102 may be conducted to the thermally conductive layer 148 in the lower portion of the merged cavities 108 in the substrate 102 through the bottom portion of the merged cavities 108 in the substrate 102 and dissipated through the first and second contact pillars, 120*a* and 120*b*, respectively. The dielectric liner 116 over sidewalls of an upper portion of the merged cavities 108 in the substrate 102 and over part of a lower portion of the merged cavities 108 in the substrate 102 may function as a thermal insulator and controls heat flow within the merged cavities 108 in the substrate 102.

Figure 2:
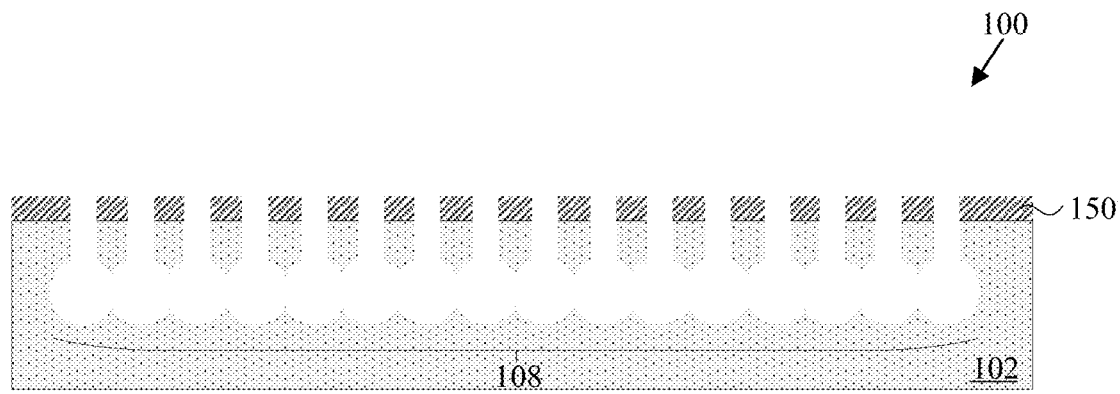
FIGS. 2 to 18 illustrate a fabrication process flow for the semiconductor device illustrated in FIG. 1A, according to embodiments of the disclosure.

FIGS. 2 to 18 illustrate a fabrication process flow for the semiconductor device 100 illustrated in FIG. 1A, according to embodiments of the disclosure. FIG. 2 shows a cross section view of a partially completed semiconductor device 100, according to embodiments of the disclosure. Referring to FIG. 2, a substrate 102 with merged cavities 108 in the substrate 102 may be provided. A protective nitride layer 150 may be provided on an upper surface of the substrate 102. The formation of the merged cavities 108 in the substrate 102 may include forming trenches in the protective nitride layer 150 and an upper portion of the substrate 102. A protective dielectric spacer may be formed on side walls of the trenches. In embodiments, the protective dielectric spacer may be made of silicon nitride, silicon dioxide or any suitable dielectric materials. A wet etch or dry etch process may be used to remove portions of the substrate 102 from bottom portions of the trenches thereby forming the merged cavities 108 in the substrate 102. In embodiments, the protective dielectric spacer may subsequently be removed from sidewalls of the trenches by a wet etch or dry etch process. In further embodiments, the protective dielectric spacer may remain over the sidewalls of the trenches. For simplicity, the protective dielectric spacer is not shown in FIG. 2. The trenches may subsequently be referred to as an upper portion of the merged cavities 108 in the substrate 102.

Figure 3:
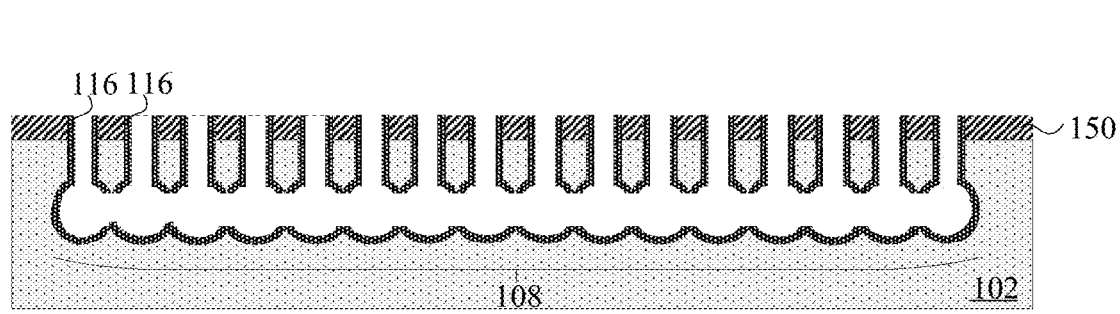

FIG. 3 shows a cross section view of a partially completed semiconductor device 100 after formation of a dielectric liner 116, according to embodiments of the disclosure. In embodiments, the dielectric liner 116 may be formed over sidewalls and a bottom surface of the merged cavities 108 in the substrate 102. The dielectric liner 116 may be formed by thermal oxidation or any other suitable oxidation or deposition processes.

Figure 4:
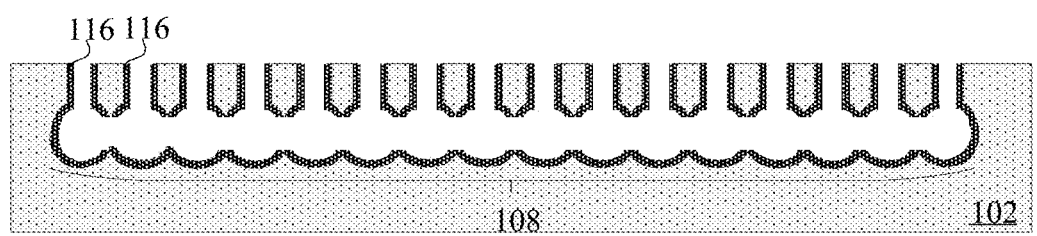

FIG. 4 shows a cross section view of a partially completed semiconductor device 100 after removal of the protective nitride layer 150, according to embodiments of the disclosure. The protective nitride layer 150 may be removed by a hot phosphoric acid solution or any other suitable removal processes. The removal process leaves behind the dielectric liner 116 over the sidewalls and bottom surface of the merged cavities 108 in the substrate 102 and exposes the upper surface of the substrate 102.

Figure 5:
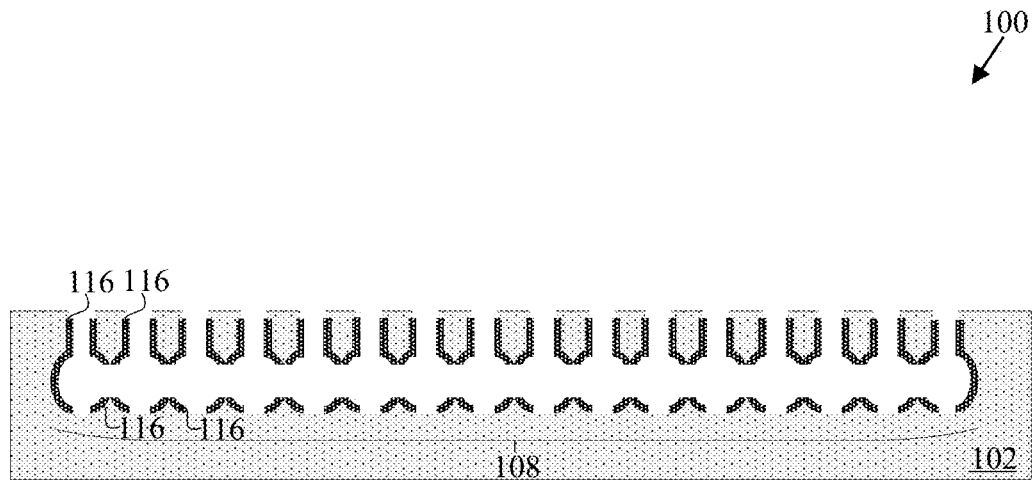

FIG. 5 shows a cross section view of a partially completed semiconductor device 100 after partial removal of the dielectric liner 116 by a suitable removal process in one embodiment. Portions of the dielectric liner 116 may be removed from the top and bottom surfaces of the merged cavities 108 in the substrate 102 by a suitable removal process, which may be anisotropic etching, for example. The term "anisotropic etching" may refer to an etching process that is directional in nature. An upper portion of the substrate 102 next to the top surface of the merged cavities 108 in the substrate 102 and a lower portion of the substrate 102 next to the bottom surface of the merged cavities 108 in the substrate 102 may be exposed by the removal process. The removal process leaves behind the dielectric liner 116 over sidewalls and partially covering a lower portion of the merged cavities 108 in the substrate 102 thereby exposing a bottom surface of the merged cavities 108 in the substrate 102.

Figure 6:
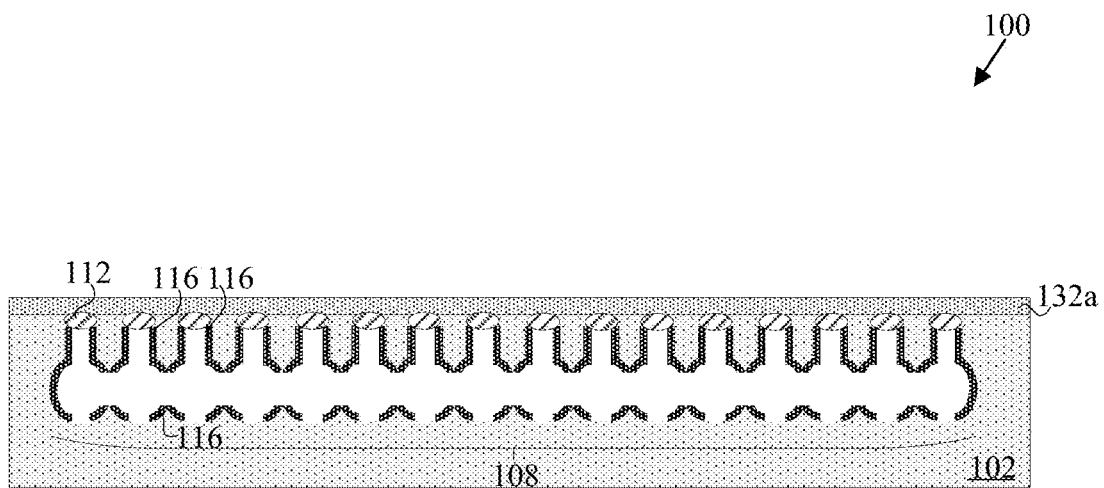

FIG. 6 shows a cross section view of a partially completed semiconductor device 100 after formation of a plug 112 over an upper portion of the merged cavities 108 in the substrate 102 and formation of a lower portion of an epitaxial layer 132*a*, according to embodiments of the disclosure. The formation of a plug 112 may include depositing a layer of suitable semiconductor material, for example germanium, over a top surface of the substrate 102 at a temperature equal to or greater than the reflow temperature of germanium. The germanium layer may reflow to plug or fill the top of the merged cavities 108 in the substrate 102 without filling in the merged cavities 108 in the substrate 102. An epitaxial layer made of a suitable semiconductor material, for example silicon, may subsequently be formed over the plug 112 and the top surface of the substrate 102 to form the lower portion of the epitaxial layer 132*a* thereby presenting a planar surface for subsequent device formation.

Figure 7:
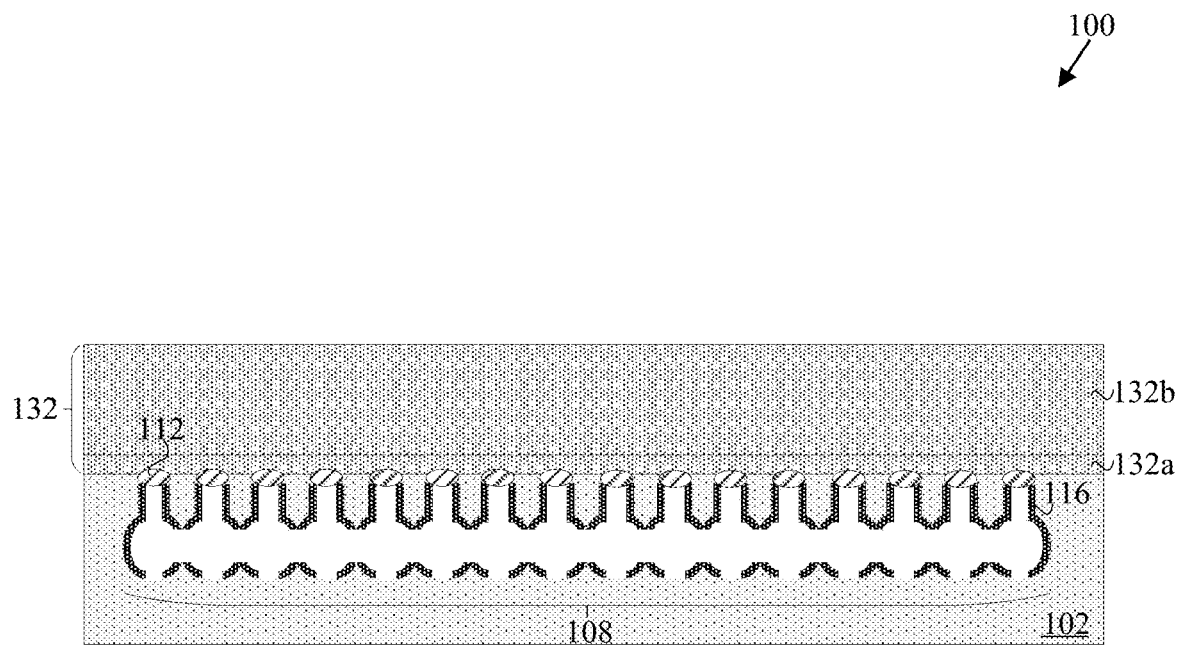

FIG. 7 shows a cross section view of a partially completed semiconductor device 100 after formation of an epitaxial layer 132, according to some embodiments of the disclosure. An upper portion of the epitaxial layer 132*b* made of a suitable semiconductor material, for example silicon, may be formed over the lower portion of the epitaxial layer 132*a* thereby forming the epitaxial layer 132. The thickness of the epitaxial layer 132 determines a distance of the merged cavities 108 in the substrate 102 from a top surface of the epitaxial layer 132. Thereby the merged cavities 108 in the substrate 102 may directly contact the epitaxial layer 132 to facilitate efficient thermal dissipation from the epitaxial layer 132.

Figure 8:
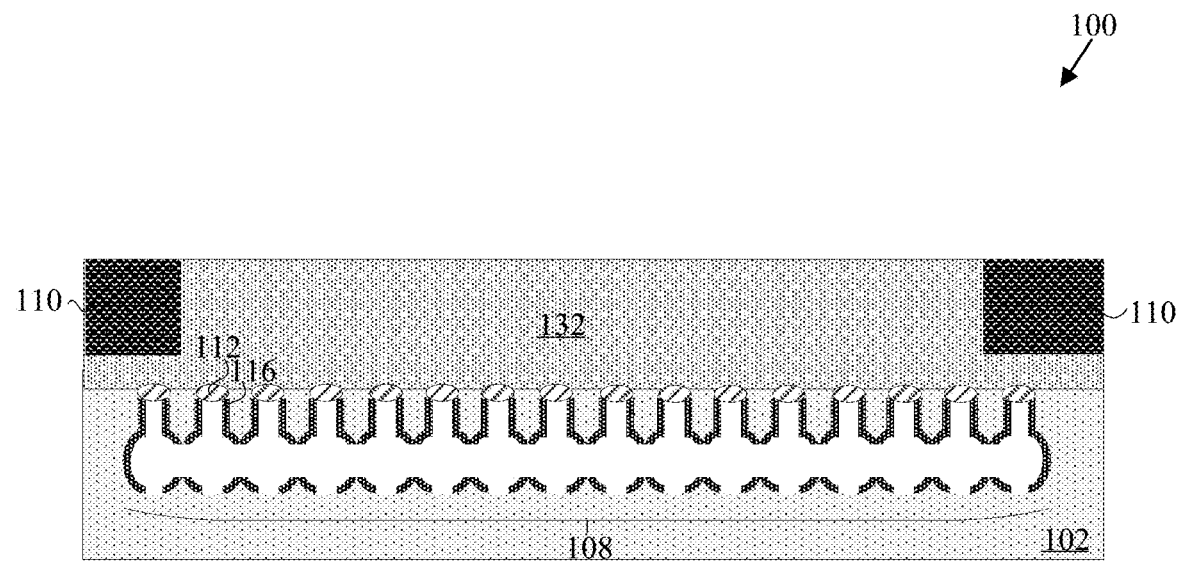

FIG. 8 shows a cross section view of a partially completed semiconductor device 100 after formation of isolation structures 110 in the epitaxial layer 132 over the merged cavities 108 in the substrate 102, according to embodiments of the disclosure. The formation of isolation structures 110 may include forming a trench in the epitaxial layer 132 followed by deposition of a suitable insulating material, for example silicon dioxide, into the trench. A suitable planarization process, for example chemical mechanical planarization (CMP), may be used to remove the silicon dioxide from an upper surface of the epitaxial layer 132 thereby leaving behind the silicon dioxide in the trench to form the isolation structures 110. The isolation structures 110 may define an area of the active region 138.

Figure 9:
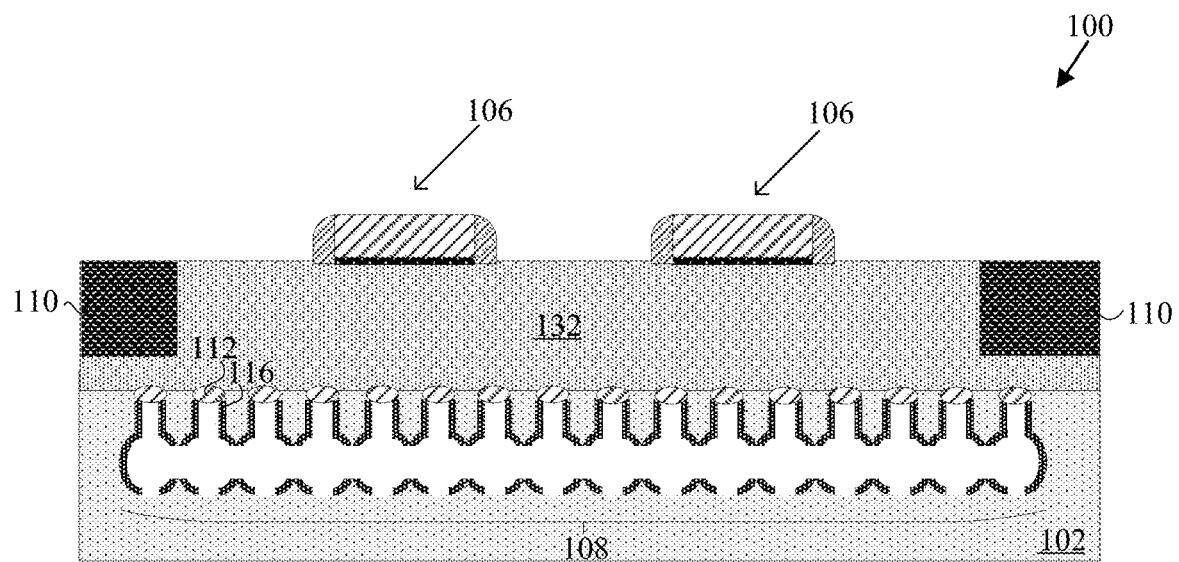

FIG. 9 shows a cross section view of a partially completed semiconductor device 100 after formation of gate structures 106 over the epitaxial layer 132, according to embodiments of the disclosure. The gate structures 106 may include gate electrodes, gate dielectric layers between the epitaxial layer 132 and the gate electrodes and spacer structures on sidewalls of the gate electrodes. The formation of gate structures 106 is well known in the art and will not be further elaborated upon. Although not shown, well regions and doped source and drain regions may be formed in the epitaxial layer 132 above the merged cavities 108 in the substrate 102.

Figure 10:
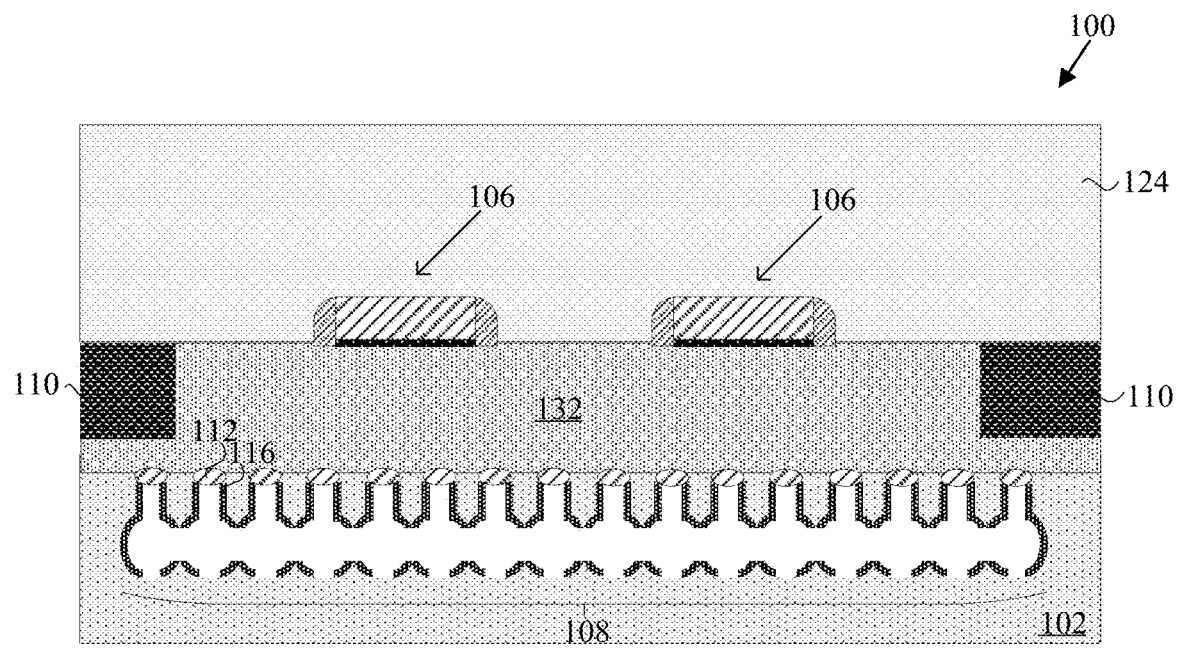

FIG. 10 shows a cross section view of a partially completed semiconductor device 100 after formation of a first interlayer dielectric (ILD) layer 124, according to embodiments of the disclosure. The first interlayer dielectric layer 124 may comprise borophosphosilicate glass (BPSG), silicon dioxide, a low dielectric constant material, or any other suitable dielectric material. The term "low dielectric constant material" may refer to a dielectric material having a dielectric constant of less than 3.9. The first interlayer dielectric layer 124 may be deposited over the gate structures 106 and the epitaxial layer 132 by chemical vapor deposition (CVD), atomic layer deposition (ALD), physical vapor deposition (PVD) or any other suitable deposition methods.

Figure 11:
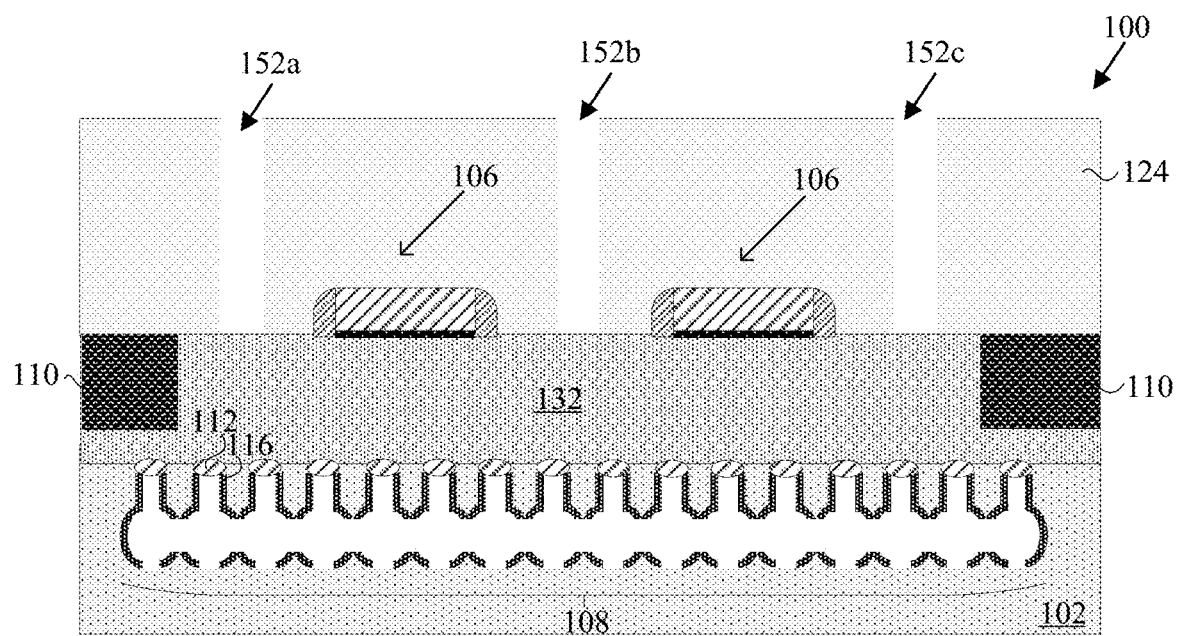

FIG. 11 shows a cross section view of a partially completed semiconductor device 100 after formation of via openings 152a-c in the first interlayer dielectric layer 124, according to embodiments of the disclosure. The formation of the via openings 152a-c may include a conventional photolithography process including deposition and patterning of a layer of photoresist material over the first interlayer dielectric layer 124. A wet or dry etch process may be used to remove the interlayer dielectric layer 124 not covered by the photoresist layer to thereby form the via openings 152a-c. The photoresist layer may subsequently be removed.

Figure 12:
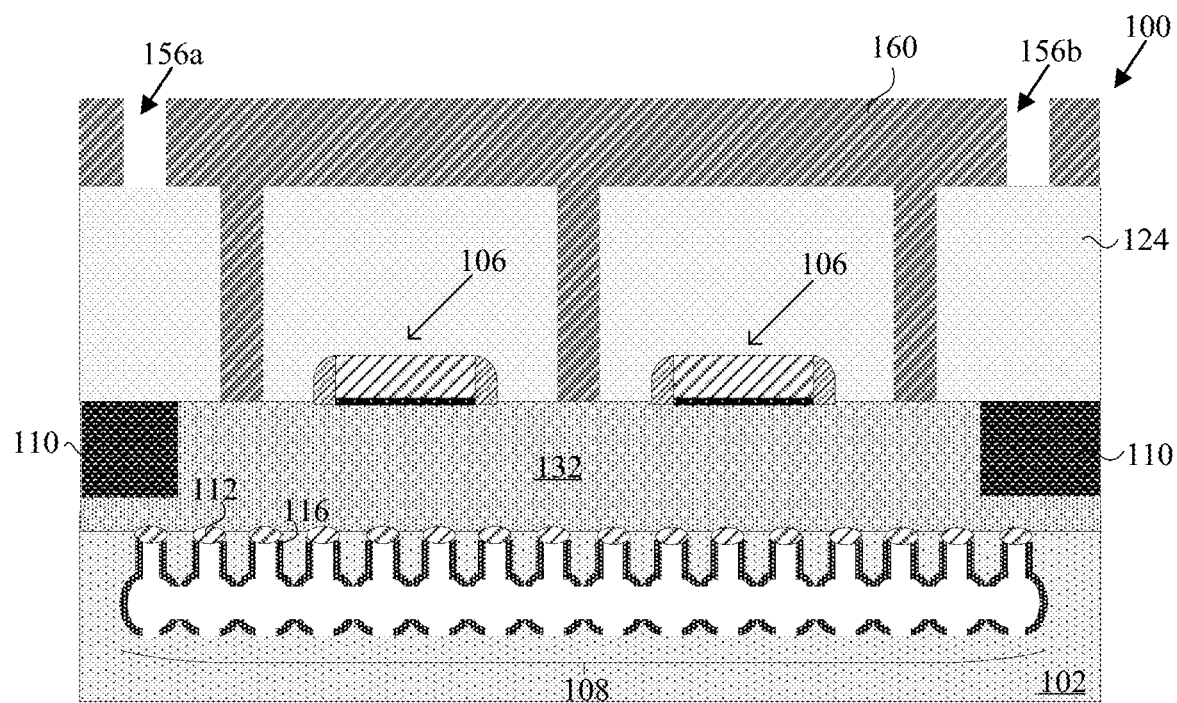

FIG. 12 shows a cross section view of a partially completed semiconductor device 100 after formation of a layer of photoresist 160 over the first interlayer dielectric layer 124, according to embodiments of the disclosure. The photoresist layer 160 may fill up the via openings 152a-c in the first interlayer dielectric layer 124. Openings 156a and 156b above the isolation structures 110 and edge portions of the merged cavities 108 in the substrate 102 may be formed in the photoresist layer 160 by conventional photolithography process.

Figure 13:
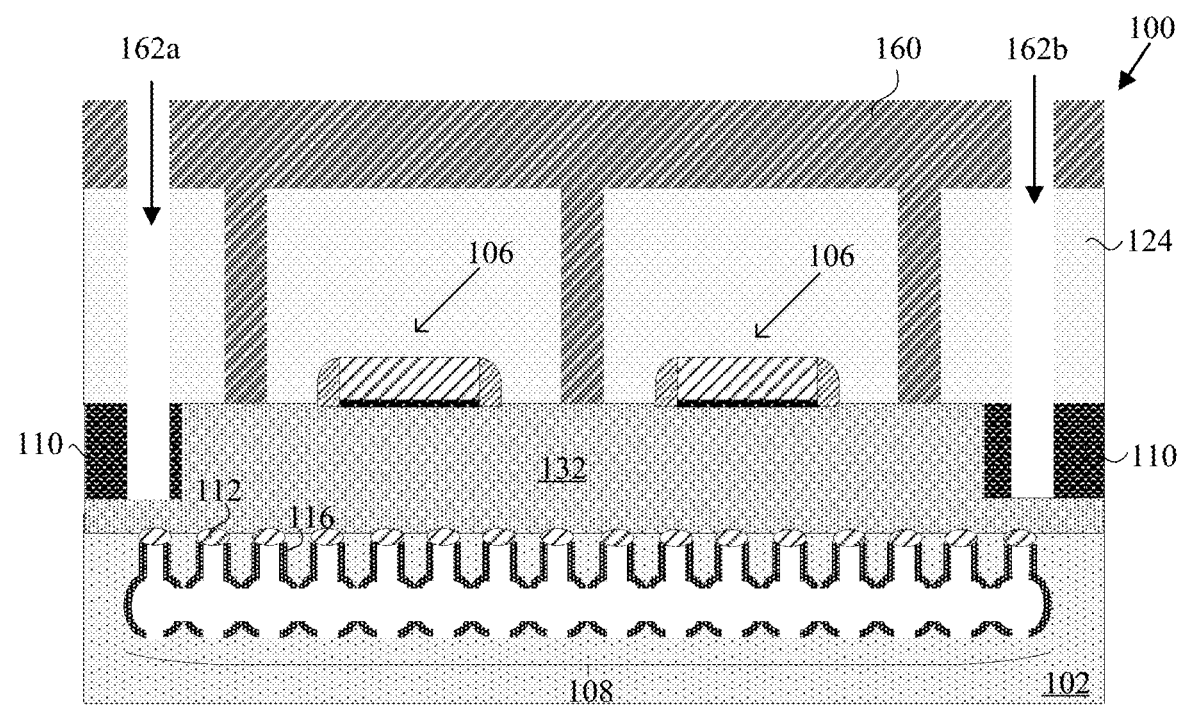

FIG. 13 shows a cross section view of a partially completed semiconductor device 100 after formation of via openings 162a and 162b in the first interlayer dielectric layer 124 and the isolation structures 110, according to some embodiments of the disclosure. A wet etch or dry etch process may be used to remove portions of the interlayer dielectric layer 124 and the isolation structures 110 not covered by the photoresist layer 160 to thereby form the via openings 162a and 162b.

Figure 14:
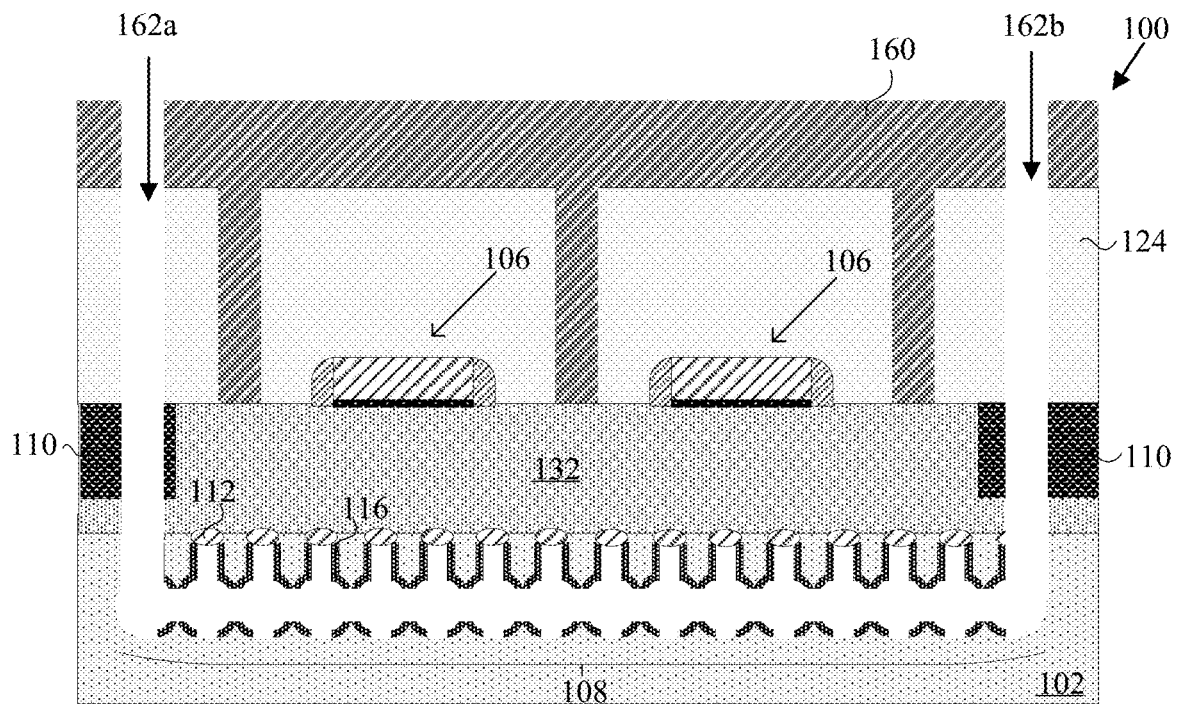

FIG. 14 shows a cross section view of a partially completed semiconductor device 100 after extension of the via openings 162a and 162b to the merged cavities 108 in the substrate 102, according to some embodiments of the disclosure. A portion of the epitaxial layer 132, the plug 112, the dielectric liner 116 and the substrate 102 above edge portions of the merged cavities 108 in the substrate 102 may be removed to extend the via openings 162a and 162b to the merged cavities 108 in the substrate 102. The removal process may be by a wet or dry etch process.

Figure 15:
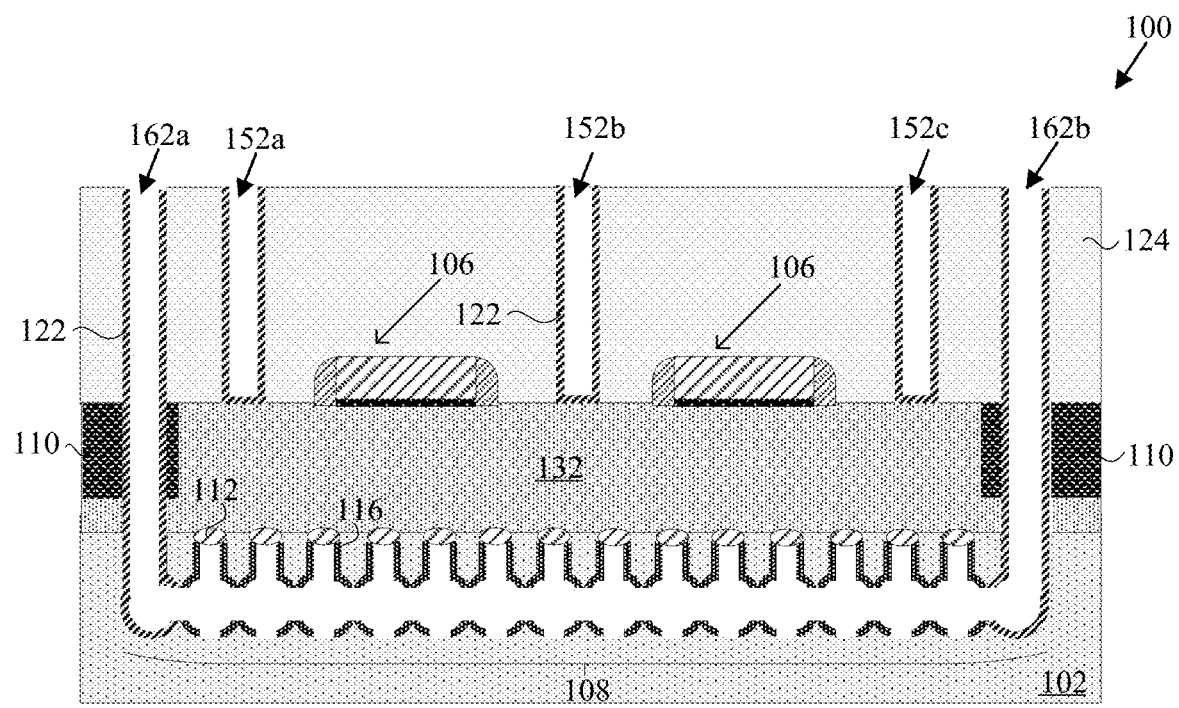

FIG. 15 shows a cross section view of a partially completed semiconductor device 100 after removal of the photoresist layer 160 and formation of a barrier liner 122 over sidewalls and bottom surfaces of the via openings 162a, 162b and 152a, 152b and 152c according to some embodiments of the disclosure. The photoresist layer 160 may be removed by conventional photoresist removal process such as ashing. The formation of the barrier liner 122 may include depositing a layer of suitable liner material, for example titanium nitride by ALD, CVD, PVD or any other suitable deposition processes.

Figure 16:
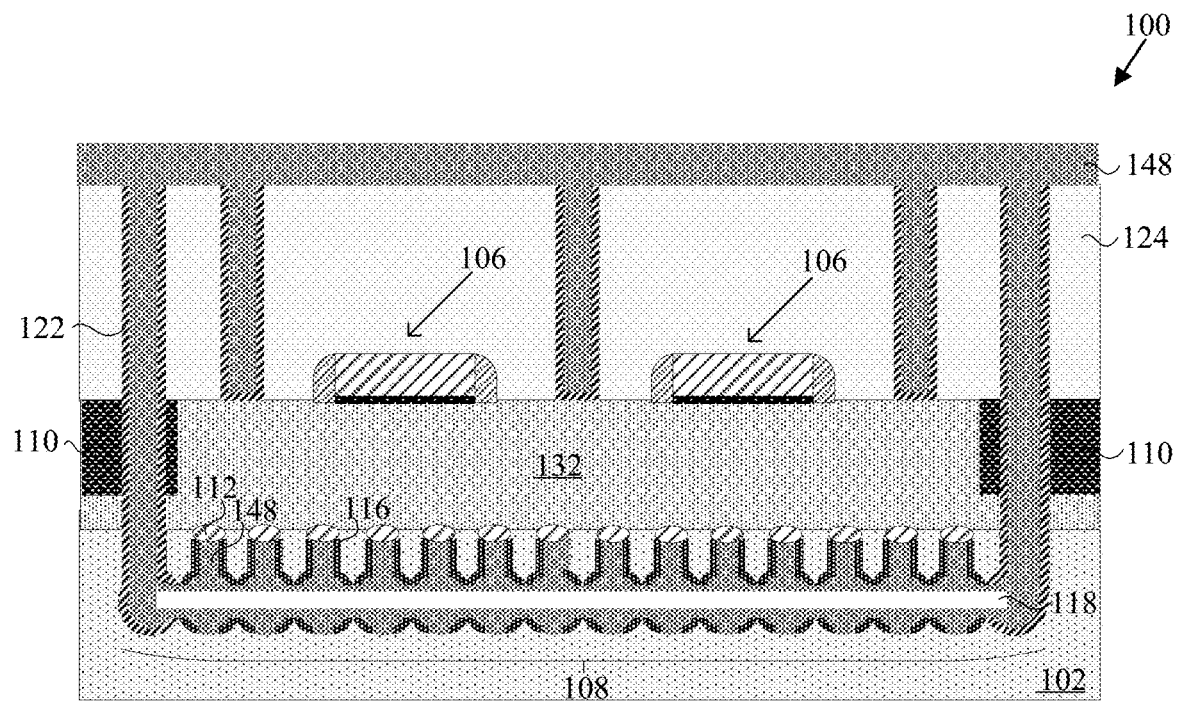

FIG. 16 shows a cross section view of a partially completed semiconductor device 100 after formation of a thermally conductive layer 148 in the merged cavities 108 in the substrate 102 and the openings 162a, 162b and 152a-c, according to embodiments of the disclosure. The formation of the thermally conductive layer 148 may include depositing a suitable thermally conductive material with a thermal conductivity higher than silicon, for example tungsten, copper, graphene, aluminum nitride, carbon nanotubes, diamond, or any other suitable thermally conductive material by ALD, CVD, PVD or any other suitable deposition processes. In some embodiments, the thermally conductive layer 148 may partially fill up the merged cavities 108 in the substrate 102 and an airgap 118 may extend across the merged cavities 108 in the substrate 102. In further embodiments, the thermally conductive layer 148 may completely fill up the merged cavities 108 in the substrate 102.

Figure 17:
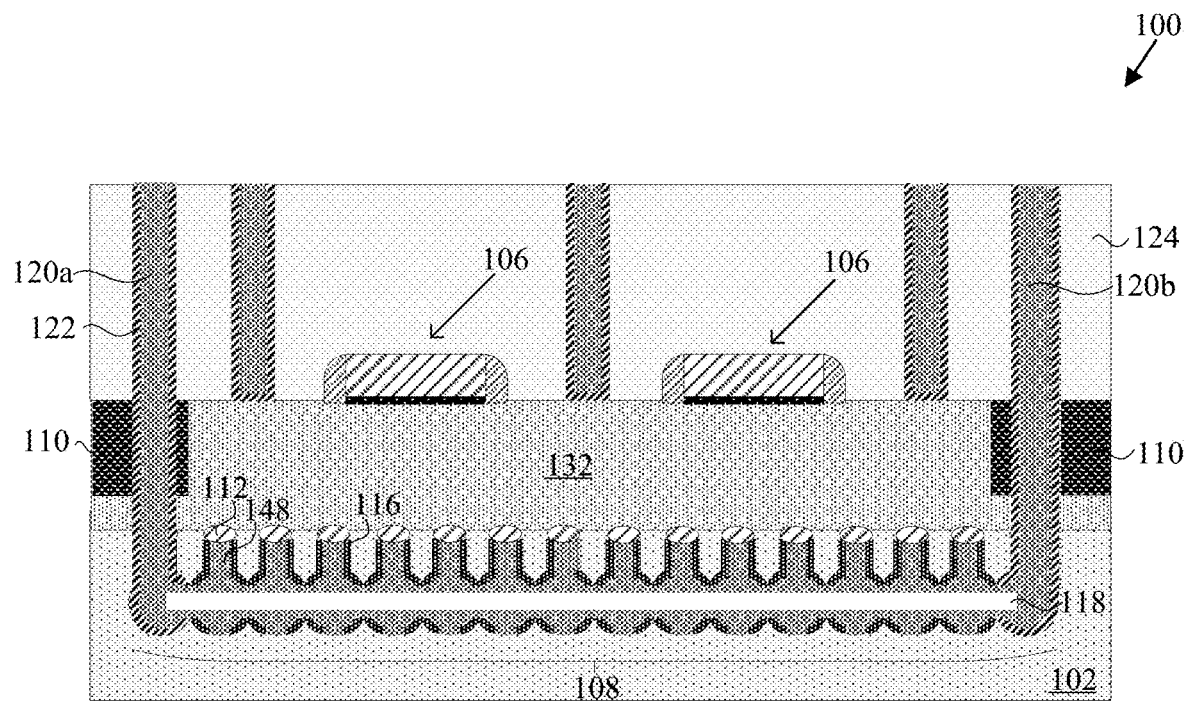

FIG. 17 shows a cross section view of a partially completed semiconductor device 100 after formation of a first and second contact pillars, 120a and 120b, respectively, according to embodiments of the disclosure. A suitable planarization process, for example CMP may be used to remove the thermally conductive layer 148 from an upper surface of the first interlayer dielectric layer 124 leaving behind the thermally conductive layer 148 in the openings 162a and 162b to thereby form the first and second contact pillars, 120a and 120b, respectively.

Figure 18:
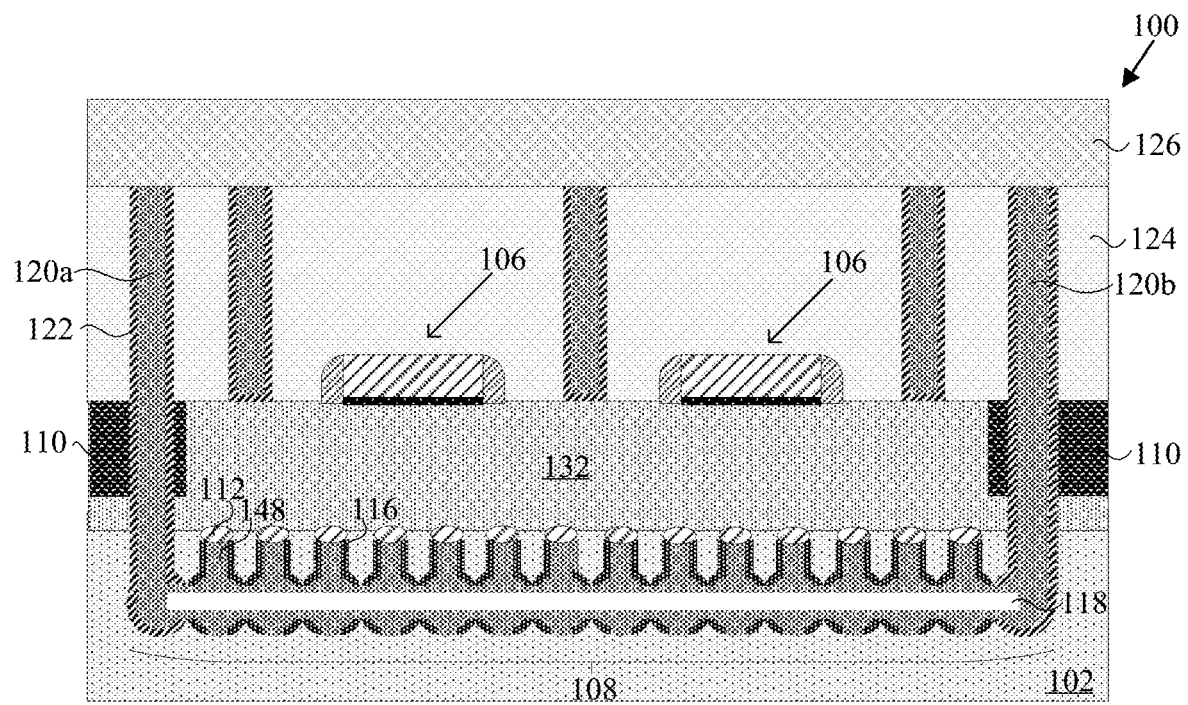

FIG. 18 shows a cross section view of a partially completed semiconductor device 100 after formation of a second interlayer dielectric layer 126 over the first and second contact pillars, 120a and 120b, respectively, and the first interlayer dielectric layer 124, according to embodiments of the disclosure. The formation of the second interlayer dielectric layer 126 may include depositing a layer of suitable dielectric material, for example silicon dioxide or a low dielectric constant material, by ALD, CVD, PVD or any other suitable deposition processes. In embodiments, the first and second interlayer dielectric layers, 124 and 126, respectively, may comprise the same materials. In further embodiments, the first and second interlayer dielectric layers, 124 and 126, respectively, may comprise different materials.

A metallization layer 128 in the second interlayer dielectric layer 126 and over the first and second contact pillars, 120a and 120b, respectively, may subsequently be formed to provide the semiconductor device 100 as illustrated in FIG. 1A. The formation of the metallization layer 128 may include forming an opening in the second interlayer dielectric layer 126 using conventional photolithography processes and a wet or dry etch followed by depositing a layer of suitable metal, for example copper, to fill up the opening. A planarization process such as CMP may be used to remove the copper from upper surfaces of the second interlayer dielectric layer 126 and leave behind the copper in the opening thereby forming the metallization layer 128.

Figure 19:
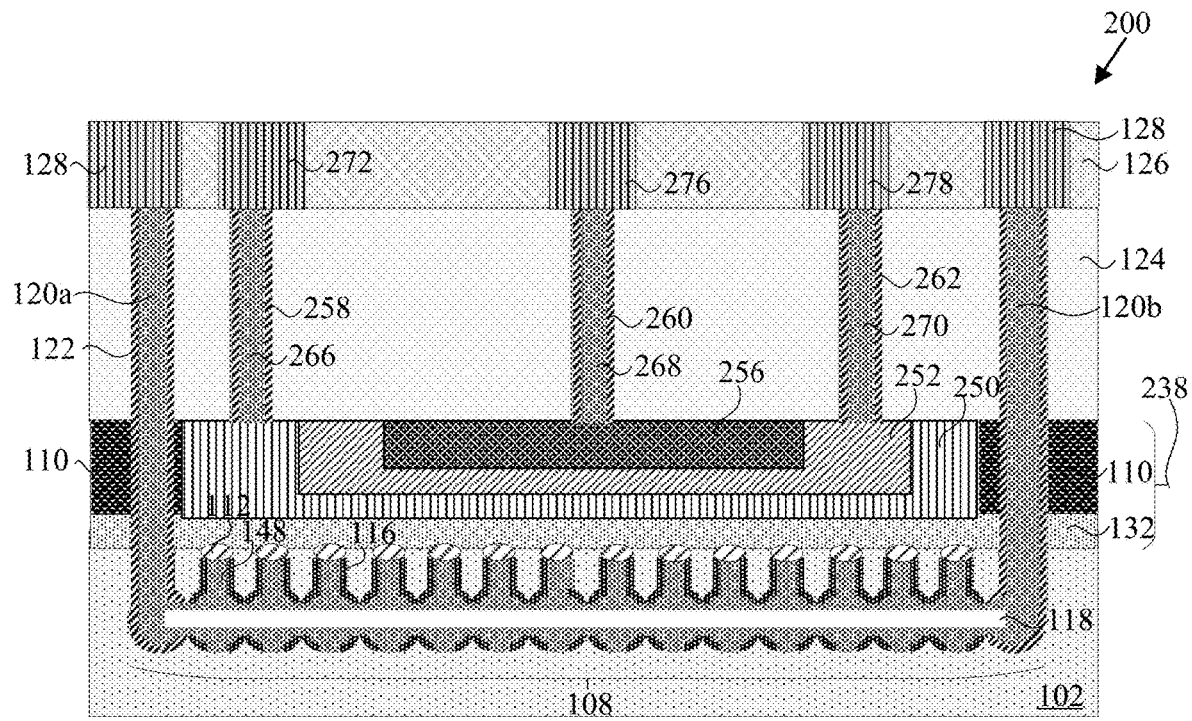
FIG. 19 is a cross-section view of a semiconductor device, according to another embodiment of the disclosure.

The embodiments shown in FIGS. 1 to 18 may be modified to form alternative embodiments within the scope of this disclosure. For example, FIG. 19 is a cross-section view of a semiconductor device 200, according to another embodiment of the disclosure. In one embodiment, the semiconductor device 200 may be a bipolar junction transistor (BJT). The same reference numerals shown in FIGS. 1 to 18 are also used in FIG. 19 to refer to identical features.

Referring to FIG. 19, the semiconductor device 200 comprises a substrate 102 with merged cavities 108 in the substrate 102. An active region 238 may be over the merged cavities 108 in the substrate 102. The active region 238 may comprise an epitaxial layer 132. A thermally conductive layer 148 may be in the merged cavities 108 in the substrate 102, whereby the thermally conductive layer 148 at least partially fills up the merged cavities 108 in the substrate 102. An airgap 118 may be arranged in the merged cavities 108 and may be surrounded by the thermally conductive layer 148. A first 120a and a second 120b contact pillars may connect the thermally conductive layer 148 in the merged cavities 108 in the substrate 102 with a metallization layer 128 above the active region 238. A semiconductor plug 112 may be arranged over an upper portion of the merged cavities 108 in the substrate 102. A dielectric liner 116 may be arranged over sidewalls of an upper portion of the merged cavities 108 in the substrate 102, whereby the dielectric liner 116 may be arranged below the semiconductor plug 112. The dielectric liner 116 may be arranged partially over a lower portion of the merged cavities 108 in the substrate 102.

The active region 238 may comprise an epitaxial layer 132 and a first doped region 250, a second doped region 252 and a third doped region 256 in the epitaxial layer 132. The first doped region 250 may be an n-doped collector region. The second doped region 252 may be a p-doped base region and may be arranged in the first doped region 250. The third doped region 256 may be an n-doped emitter region and may be arranged in the second doped region 252. Contact pillars 266, 268 and 270 may be arranged over the first doped region 250, the second doped region 252 and the third doped region 256, respectively. Metallization layers 272, 276 and 278 may be arranged over the contact pillars 266, 268 and 270, respectively. Isolation structures 110 may be formed in the epitaxial layer 132. In some embodiments, the isolation structures 110 may be shallow trench isolation (STI) structures.

The fabrication process flow of the merged cavities 108 in the substrate 102, the dielectric liner 116, the semiconductor plug 112, the epitaxial layer 132 and the isolation structures 110 of the semiconductor device 200 is similar to the fabrication process flow of the merged cavities 108 in the substrate 102, the dielectric liner 116, the semiconductor plug 112, the epitaxial layer 132 and the isolation structures 110 of the semiconductor device 100 illustrated in FIGS. 2 to 8. Referring to FIG. 19, the first 250, the second 252 and the third 256 doped regions may be formed in the epitaxial layer 132. The formation of the first 250, the second 252 and the third 256 doped regions is well-known in the arts and will not be further elaborated upon. The fabrication process flow of the first 124 and second 126 interlayer dielectric (ILD) layers, first 120a and second 120b contact pillars, the thermally conductive layer 148, the airgap 118 and the metallization layer 128 of the semiconductor device 200 is similar to the fabrication process flow of the first 124 and second 126 interlayer dielectric (ILD) layers, first 120a and second 120b contact pillars, the thermally conductive layer 148, the airgap 118 and the metallization layer 128 of the semiconductor device 100 illustrated in FIGS. 10 to 18. The contact pillars 266, 268 and 270 may be formed together with the first 120a and second 120b contact pillars. The metallization layers 272, 276 and 278 may be formed together with the metallization layer 128.

Figure 20:
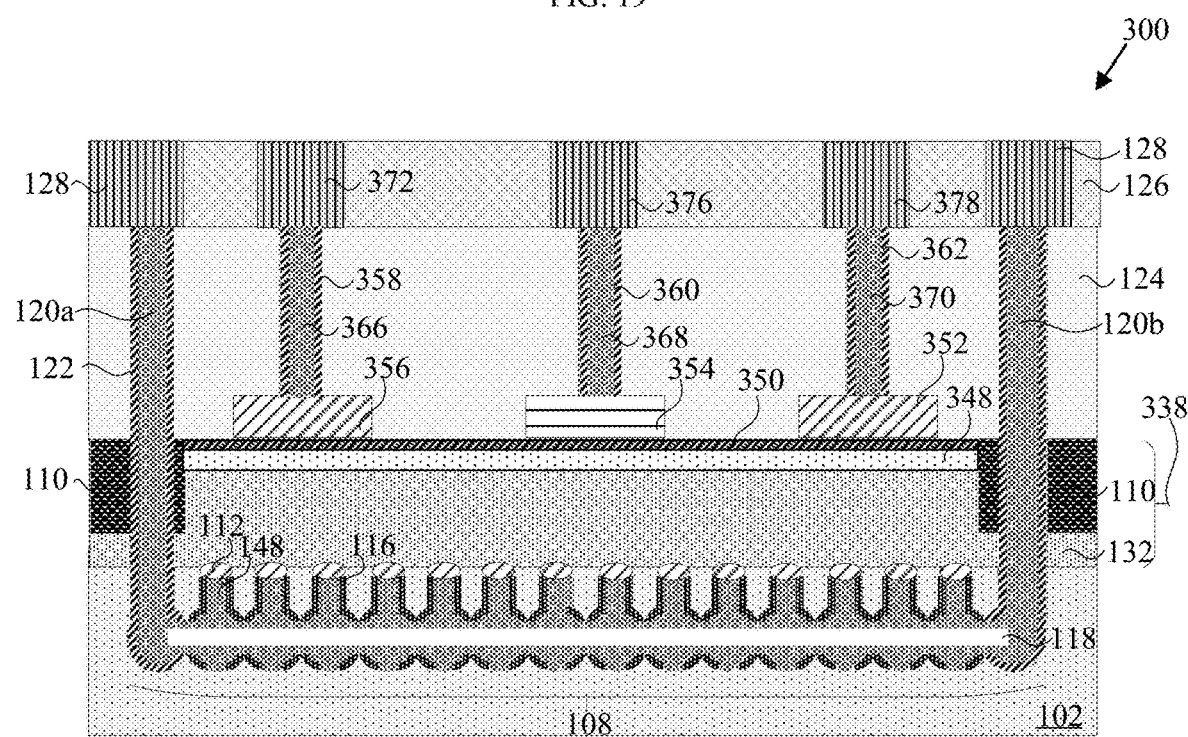
FIG. 20 is a cross-section view of a semiconductor device, according to another embodiment of the disclosure.

FIG. 20 is a cross-section view of a semiconductor device 300, according to another embodiment of the disclosure. In one embodiment, the semiconductor device 300 may be a high electron mobility transistor (HEMT). Referring to FIG. 20, the semiconductor device 300 comprises a substrate 102 with merged cavities 108 in the substrate 102. An active region 338 may be over the merged cavities 108 in the substrate 102. The active region 338 may comprise an epitaxial layer 132. A thermally conductive layer 148 may be in the merged cavities 108 in the substrate 102, whereby the thermally conductive layer 148 at least partially fills up the merged cavities 108 in the substrate 102. An airgap 118 may be arranged in the merged cavities 108 and may be surrounded by the thermally conductive layer 148. A first 120a and a second 120b contact pillars connect the thermally conductive layer 148 in the merged cavities 108 in the substrate 102 with a metallization layer 128 above the active region 338. A semiconductor plug 112 may be arranged over an upper portion of the merged cavities 108 in the substrate 102. A dielectric liner 116 may be arranged over sidewalls of the upper portion of the merged cavities 108 in the substrate 102, whereby the dielectric liner 116 may be arranged below the semiconductor plug 112. The dielectric liner 116 may be arranged partially over a lower portion of the merged cavities 108 in the substrate 102.

The active region 338 may comprise the epitaxial layer 132 and a barrier layer 348. The epitaxial layer 132 may be made of a suitable semiconductor material, for example gallium nitride (GaN). The barrier layer 348 may be arranged over the epitaxial layer 132 and may be made of a suitable doped semiconductor material, for example aluminum doped gallium nitride (AlGaN). A capping layer 350 may be arranged over the barrier layer 348. The capping layer 350 may be made of a suitable semiconductor material, for example gallium nitride. A drain 352 and a source 356 may be arranged over the capping layer 350. The drain 352 and the source 356 may be made of a suitable conductive material, for example titanium (Ti) or gold (Au). A gate 354 may be arranged between the drain 352 and the source 356. The gate 354 may be made of a suitable conductive material, for example nickel (Ni) or gold. Contact pillars 366, 368 and 370 may be arranged over the source 356, the gate 354 and the drain 352, respectively. Metallization layers 372, 376 and 378 may be arranged over the contact pillars 366, 368 and 370, respectively. Isolation structures 110 may be formed in the epitaxial layer 132.

The fabrication process flow of the merged cavities 108 in the substrate 102, the dielectric liner 116, the semiconductor plug 112, the epitaxial layer 132 and the isolation structures 110 of the semiconductor device 300 is similar to the fabrication process flow of the merged cavities 108 in the substrate 102, the dielectric liner 116, the semiconductor plug 112, the epitaxial layer 132 and the isolation structures 110 of the semiconductor device 100 illustrated in FIGS. 2 to 8. Referring to FIG. 20, the formation of the barrier layer 348 may include doping a portion of the active layer 132 with a suitable dopant, for example aluminum (Al) to thereby form the barrier layer 348. The formation of the capping layer 350 may include epitaxial growth of a suitable semiconductor material, for example gallium nitride to thereby form the capping layer 350. The formation of the drain 352, the gate 354 and the source 356 may include patterning a layer of a suitable metal, for example gold, by a conventional lift-off process. A layer of photoresist may be deposited over the capping layer 350 and patterned by a conventional photolithography process to form openings in the photoresist layer. A layer of gold may be deposited by a suitable deposition process, for example physical vapor deposition (PVD), to fill up the openings in the photoresist layer. The photoresist layer may be removed, leaving behind the layer of gold over the capping layer 350, to thereby form the drain 352, the gate 354 and the source 356.

The fabrication process flow of the first 124 and second 126 interlayer dielectric (ILD) layers, first 120a and second 120b contact pillars, the thermally conductive layer 148, the airgap 118 and the metallization layer 128 of the semiconductor device 300 is similar to the fabrication process flow of the first 124 and second 126 interlayer dielectric (ILD) layers, first 120a and second 120b contact pillars, the thermally conductive layer 148, the airgap 118 and the metallization layer 128 of the semiconductor device 100 illustrated in FIGS. 10 to 18. The contact pillars 366, 368 and 370 may be formed together with the first 120a and second 120b contact pillars. The metallization layers 372, 376 and 378 may be formed together with the metallization layer 128.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A semiconductor device comprising:
   a substrate, the substrate comprising:
   merged cavities;
   a dielectric liner lining the merged cavities, the dielectric liner having an opening that exposes a portion of the substrate; and
   a thermally conductive layer in the merged cavities, wherein the thermally conductive layer at least partially fills up the merged cavities and contacts the substrate in the opening of the dielectric liner;
   a first contact pillar partially in the substrate at an end portion of the merged cavities, the first contact pillar connecting to the merged cavities; and
   a metallization layer above the substrate connecting to the first contact pillar.

2. The semiconductor device of claim 1 further comprising:
   a plug over an upper portion of the merged cavities in the substrate, wherein the plug includes a semiconductor material.

3. The semiconductor device of claim 1 further comprising:
   an airgap extending across the merged cavities in the substrate, wherein the airgap is surrounded by the thermally conductive layer.

4. The semiconductor device of claim 2, wherein:
   the dielectric liner is below the plug.

5. The semiconductor device of claim 1, wherein the thermally conductive layer includes thermally conductive material with a thermal conductivity higher than silicon.

6. The semiconductor device of claim 1, wherein the thermally conductive layer completely fills up a remaining portion of the merged cavities in the substrate.

7. The semiconductor device of claim 1, wherein the first contact pillar comprises a trench or a through-silicon via (TSV).

8. The semiconductor device of claim 1, wherein the metallization layer is connected to a ground terminal.

9. The semiconductor device of claim 1 further comprising:
   a second contact pillar partially in the substrate at an opposite end of the merged cavities, the second contact pillar connects to the thermally conductive layer in the merged cavities.

10. The semiconductor device of claim 9, wherein the first contact pillar and the second contact pillar comprise sidewalls, and a barrier liner is over the sidewalls of the first contact pillar and the second contact pillar.

11. The semiconductor device of claim 10, wherein the barrier liner and the dielectric liner comprise different materials.

12. A semiconductor device comprising:
    a substrate, the substrate comprising:
    merged cavities;
    a dielectric liner lining the merged cavities, the dielectric liner having an opening that exposes a portion of the substrate; and
    a thermally conductive layer in the merged cavities, wherein the thermally conductive layer at least partially fills up the merged cavities and contacts the substrate in the opening;
    a contact pillar partially in the substrate at an end portion of the merged cavities, the contact pillar comprises the thermally conductive layer and is connecting to the merged cavities; and
    a metallization layer above the substrate connecting to the contact pillar.

13. The semiconductor device of claim 12 further comprising:
    an active region over the substrate, wherein the merged cavities is directly under the active region and a portion of the contact pillar extends from the substrate through the active region.

14. The semiconductor device of claim 13, wherein the merged cavities in the substrate is directly contacting the active region.

15. The semiconductor device of claim 14 further comprising:

an isolation structure in the active region, the isolation structure electrically isolates the contact pillar from the active region.

16. A method of fabricating a semiconductor device comprising:
    forming merged cavities in a substrate;
    forming a dielectric liner lining the merged cavities, the dielectric liner having an opening that exposes a portion of the substrate;
    forming a thermally conductive layer in the merged cavities, wherein the thermally conductive layer at least partially fills up the merged cavities and contacts the substrate in the opening of the dielectric liner; and
    forming a contact pillar partially in the substrate at an end portion of the merged cavities to connect to the merged cavities in the substrate; and
    forming a metallization layer above the substrate.

17. The method of claim 16, further comprising:
    forming a plug in the substrate, the plug is over an upper portion of the merged cavities.

18. The method of claim 17, further comprising:
    forming an active region in the substrate using an epitaxial process, the active region is over the plug and the merged cavities in the substrate.

19. The method of claim 18, wherein forming a thermally conductive layer in the merged cavities comprises:
    depositing a thermally conductive layer in the merged cavities in the substrate.

20. The method of claim 19, wherein forming the contact pillar further comprises:
    forming the contact pillar through the active region, wherein the contact pillar extends from the merged cavities in the substrate to above the active region.

* * * * *